(12) United States Patent
Jung

(10) Patent No.: US 7,902,079 B2
(45) Date of Patent: Mar. 8, 2011

(54) METHOD FOR FABRICATING RECESS PATTERN IN SEMICONDUCTOR DEVICE

(75) Inventor: Yong-Soon Jung, Ichon-shi (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 825 days.

(21) Appl. No.: 11/771,232

(22) Filed: Jun. 29, 2007

(65) Prior Publication Data

US 2008/0081484 A1    Apr. 3, 2008

(30) Foreign Application Priority Data

Sep. 29, 2006 (KR) .................. 10-2006-0096507

(51) Int. Cl.
*H01L 21/302* (2006.01)
(52) U.S. Cl. .......... 438/717; 438/719; 438/725; 438/736
(58) Field of Classification Search .................. 438/717, 438/719, 725, 736
See application file for complete search history.

(56) References Cited

U.S. PATENT DOCUMENTS

| | | | | |
|---|---|---|---|---|
| 5,126,006 A | * | 6/1992 | Cronin et al. | .................. 438/702 |
| 6,888,251 B2 | * | 5/2005 | Cooney et al. | ................. 257/774 |
| 2005/0170593 A1 | | 8/2005 | Kang et al. | |
| 2006/0177743 A1 | * | 8/2006 | Ishiwata | ........................... 430/5 |
| 2007/0202690 A1 | * | 8/2007 | Ho et al. | ....................... 438/637 |

FOREIGN PATENT DOCUMENTS

| | | |
|---|---|---|
| KR | 1020050025197 | 3/2005 |
| KR | 1020060124385 | 12/2006 |
| KR | 2007-0081214 | 8/2007 |

\* cited by examiner

*Primary Examiner* — Binh X Tran
(74) *Attorney, Agent, or Firm* — Lowe Hauptman Ham & Berner LLP

(57) ABSTRACT

A method for fabricating a recess pattern in a semiconductor device includes defining an active region on a substrate, forming a first mask pattern over the active region in a line type structure, forming a second mask pattern comprising an open region over the active region, the open region exposing a portion where the active region and the first mask pattern intersect, and etching the active region of the substrate exposed by the first and second mask patterns to form recess patterns.

8 Claims, 10 Drawing Sheets

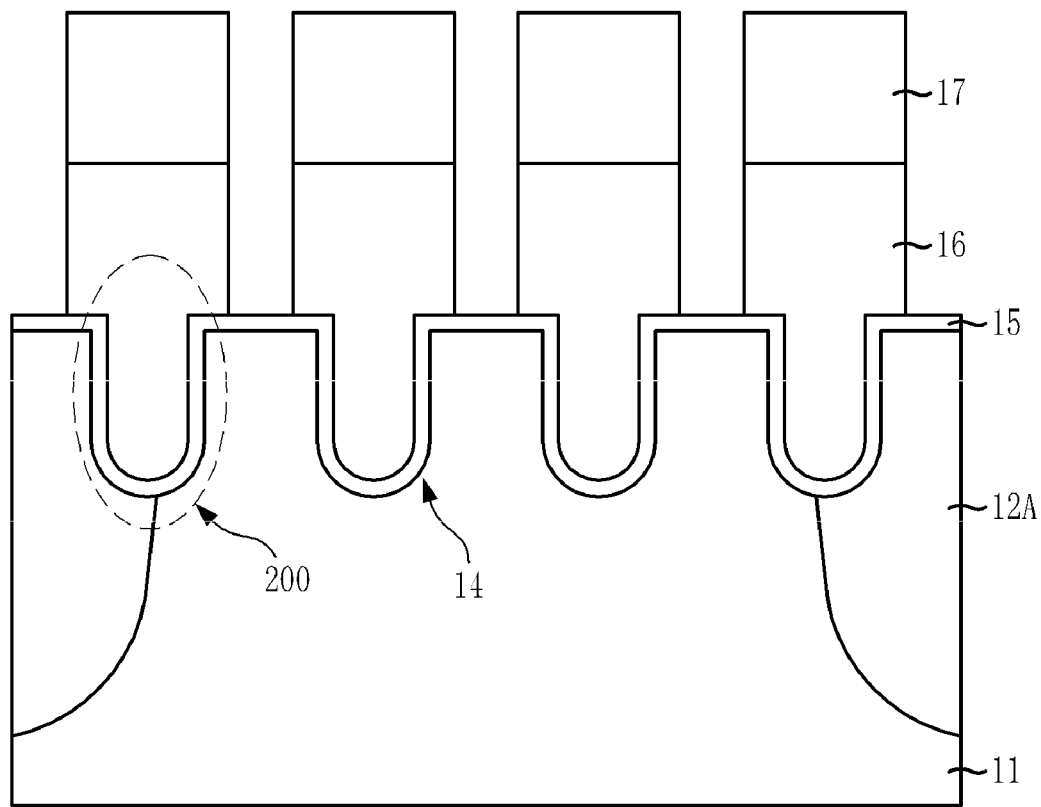

METHOD FOR FABRICATING RECESS PATTERN IN SEMICONDUCTOR DEVICE

CROSS-REFERENCE TO RELATED APPLICATIONS

The present invention claims priority of Korean patent application number 10-2006-0096507, filed on Sep. 29, 2006, which is incorporated by reference in its entirety.

BACKGROUND OF THE INVENTION

The present invention relates to a method for fabricating a semiconductor device, and more particularly, to a method for fabricating a recess pattern in a semiconductor device.

As semiconductor devices become highly integrated, a gate channel length has decreased and an ion implantation doping concentration has increased in a method for forming a typical planar gate in which a gate is formed over a planarized active region. Thus, a junction leakage current is generated by an increased electric field. Therefore, it has become difficult to secure a refresh characteristic of a device.

To overcome aforementioned limitations, a recess gate process including a gate line formation method in which an active region of a substrate is etched into a recess pattern and a gate is then formed has been performed. Using the recess gate process reduces the channel length increase and the ion implantation doping concentration. Thus, the refresh characteristic is improved.

FIG. 1 illustrates a micrographic view of a typical recess pattern in a semiconductor device. An isolation structure 12 is formed in a substrate 11 to define active regions. The active regions are formed in a direction along a major axis. The active regions include line type recess patterns 14 formed in a direction along a minor axis. A method for forming the recess patterns 14 is described in FIGS. 2A to 2C.

FIGS. 2A to 2C illustrate cross-sectional views of a typical method for fabricating a recess pattern in a semiconductor device. The same or like reference numerals used for the descriptions in FIG. 1, FIGS. 2A to 2C, and FIG. 3 represent the same or like elements for convenience of description.

Referring to FIG. 2A, an isolation structure 12 is formed in a substrate 11 to define an active region. A mask pattern 13 is formed over the resultant structure, the mask pattern 13 exposing recess pattern regions. The mask pattern 13 is formed in a line type structure and formed over the substrate 11 with a uniform spacing distance. The mask pattern 13 is formed over the isolation structure 12 as well as the active region.

Referring to FIG. 2B, the substrate 11 is etched using the mask pattern 13 as an etch mask to form recess patterns 14. Reference numeral 12A refers to a remaining isolation structure 12A.

Referring to FIG. 2C, a gate insulation layer 15 is formed over the surface profile of the resultant structure. Gate patterns are formed in a manner that a portion of the gate patterns is filled in the recess patterns 14 and the rest of the gate patterns protrude above the substrate 11. Each gate pattern includes a stack structure configured with a gate electrode 16 and a gate hard mask 17.

In the typical method, the recess patterns 14 are formed over both the isolation structure 12 and the active region of the substrate 11. A gate line width has decreased to 70 nm or less as the design rule becomes finer. Thus, patterning for securing a small space of 40 nm or less is required.

The typical method forms the recess patterns 14 in a small space, and thus, a portion of the substrate 11 adjacent to the isolation structure 12 may be damaged (as shown with reference numeral 100 in FIG. 1). Consequently, a coupling 200 results between the active region and the gate pattern. A cell transistor may not operate due to the coupling 200. FIG. 3 illustrates a micrographic view of the coupling 200 generated during the typical method for forming the recess pattern in the semiconductor device.

Such a limitation makes a device process difficult to perform, and mass production may decrease due to a low process margin. Also, the mask pattern for forming the recess patterns is often required to include argon fluoride (ArF) photoresist layer, which is elaborate and expensive, due to the finer design rule.

SUMMARY OF THE INVENTION

Embodiments of the present invention are directed to providing a method for fabricating a recess pattern in a semiconductor device, which can reduce undesirable events caused by a coupling between an active region and a gate pattern while forming a recess pattern due to finer design rule. Also, process cost caused by using an argon fluoride (ArF) photoresist layer as a mask pattern can be reduced.

In accordance with one embodiment of the present invention, there is provided a method for fabricating a recess pattern in a semiconductor device, including: defining an active region on a substrate; forming a first mask pattern over the active region in a line type structure; forming a second mask pattern comprising an open region over the active region, the open region exposing a portion where the active region and the first mask pattern intersect; and etching the active region of the substrate exposed by the first and second mask patterns to form recess patterns.

BRIEF DESCRIPTION OF THE DRAWINGS

FIGS. 2A to 2C illustrate cross-sectional views of a typical method for fabricating a recess pattern in a semiconductor device.

DETAILED DESCRIPTION OF THE PREFERRED EMBODIMENTS

Figure 1:
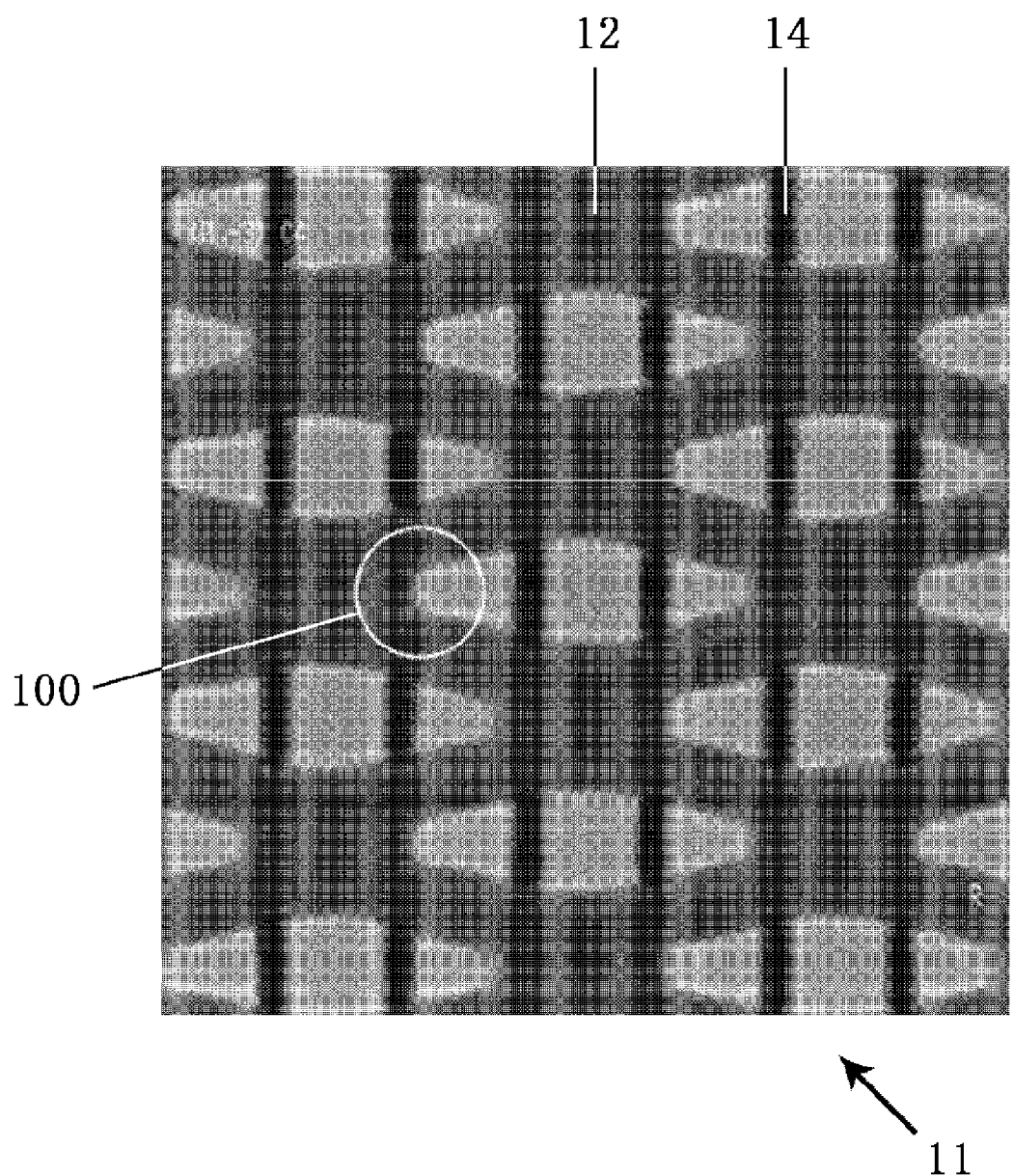
FIG. 1 illustrates a micrographic view of a typical recess pattern in a semiconductor device.
Figure 2A:
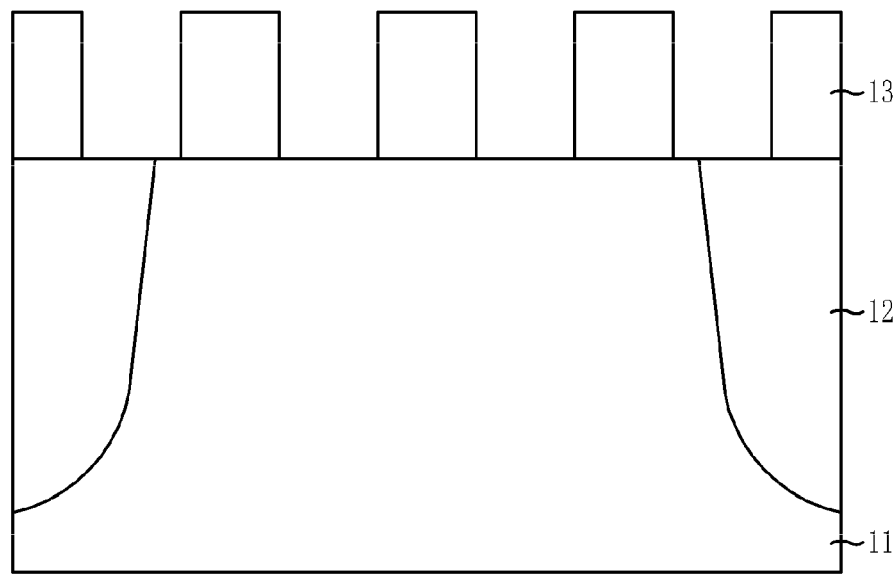
Figure 2B:
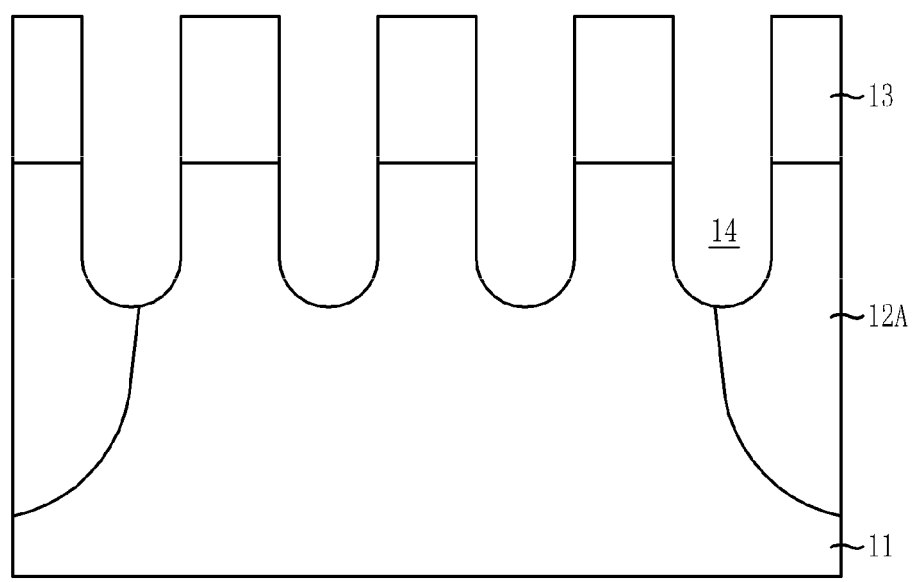
Figure 3:
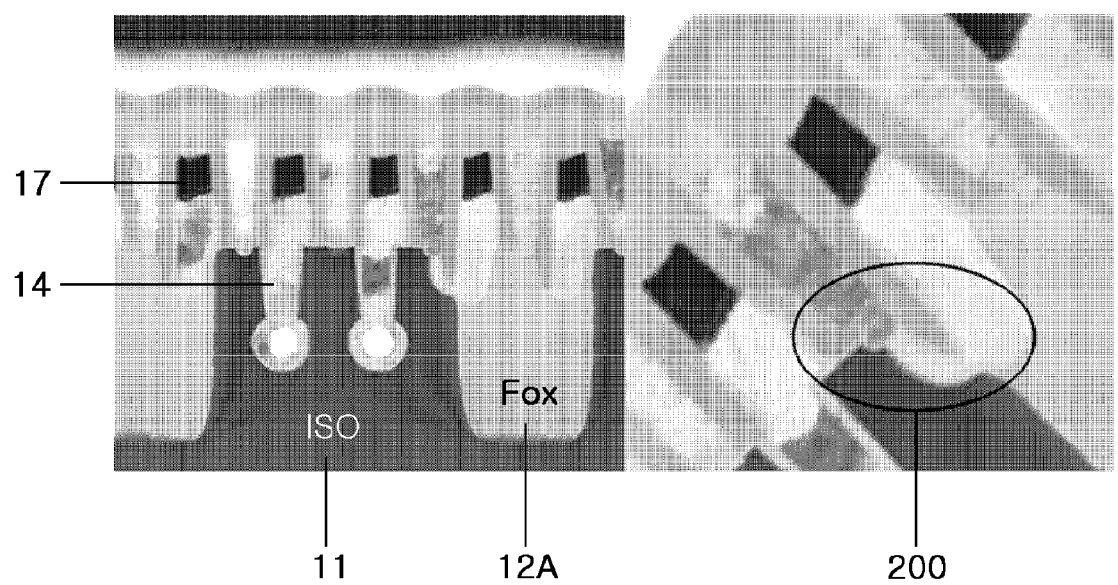
FIG. 3 illustrates a micrographic view of a typical recess gate in a semiconductor device.

Hereinafter, embodiments of the present invention relate to a method for fabricating a recess pattern in a semiconductor device.

FIGS. 4A to 4F illustrate cross-sectional views of a recess pattern in a semiconductor device in accordance with an embodiment of the present invention. FIGS. 5A to 5F illustrate top views of a recess pattern in a semiconductor device in accordance with the embodiment of the present invention. The same or like reference numerals throughout the various embodiments of the present invention represent the same or like elements in different drawings for convenience of description.

Figure 4A:
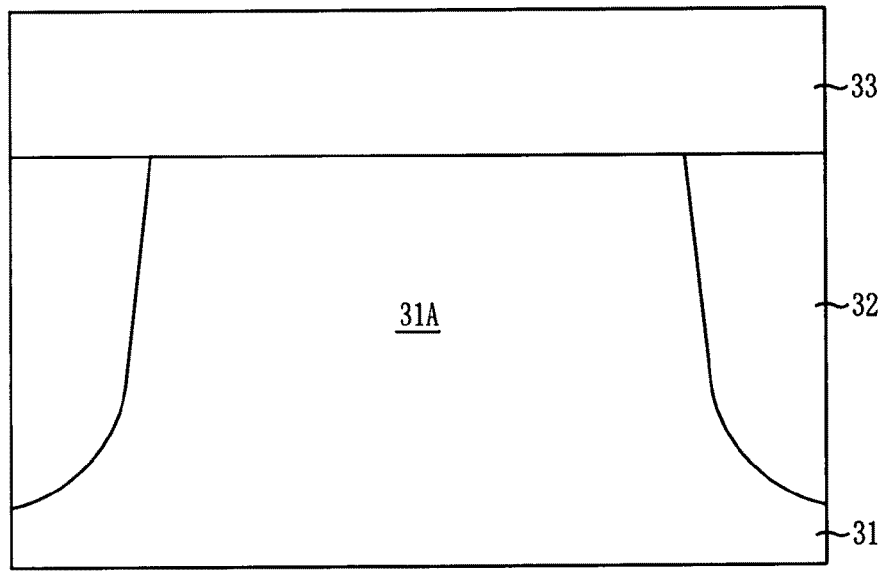
FIGS. 4A to 4F illustrate cross-sectional views of a recess pattern in a semiconductor device in accordance with an embodiment of the present invention.
Figure 5A:
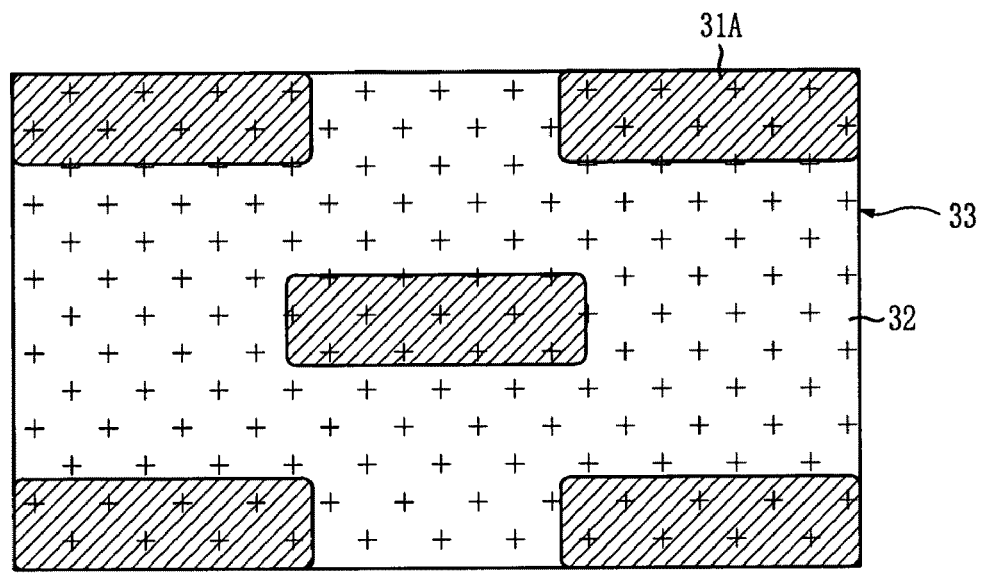
FIGS. 5A to 5F illustrate top views of a recess pattern in a semiconductor device in accordance with the embodiment of the present invention.

Referring to FIGS. 4A and 5A, an isolation structure 32 is formed in a substrate 31. The isolation structure 32 defines active regions 31A. The isolation structure 32 is formed by selectively etching the substrate 31 to form trenches, forming an insulation layer filled in the trenches, and planarizing the insulation layer. The isolation structure 32 is formed to a larger depth than a depth of subsequent recess patterns.

A hard mask layer 33 is formed over the substrate 31. The hard mask layer 33 is illustrated as being transparent in FIG. 5A and in the following drawings for better understanding. The hard mask layer 33 is formed for a subsequent recess etch process and can comprises polysilicon for instance.

Figure 4B:
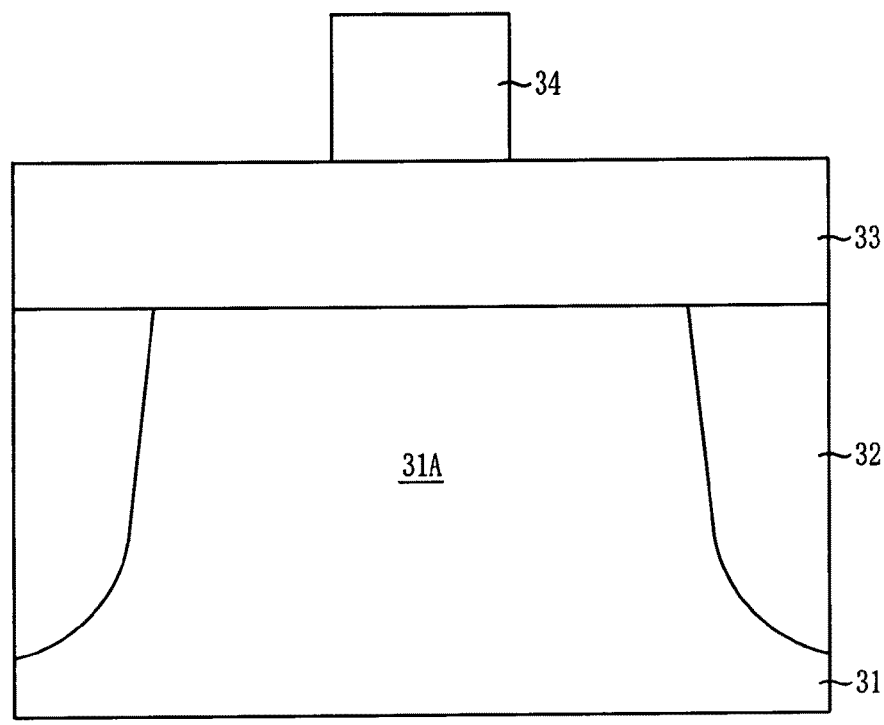
Figure 5B:
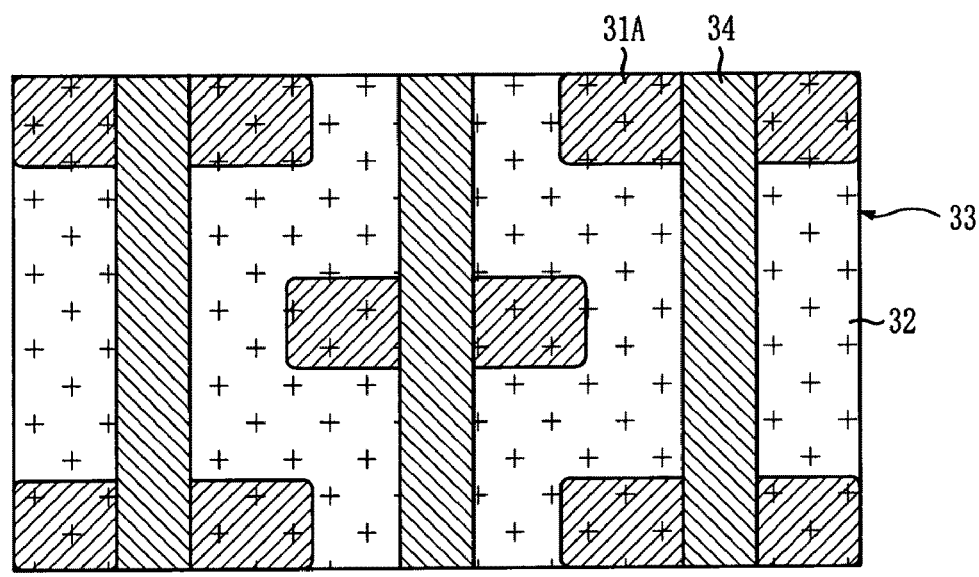

Referring to FIGS. 4B and 5B, first photoresist patterns 34 are formed over the hard mask layer 33. The first photoresist patterns 34 are formed in a line type structure crossing a middle portion of the active regions 31A.

A photolithography process margin may be secured because one line type first photoresist pattern 34 crosses one active region 31A, unlike a typical method. That is, a krypton fluoride (KrF) exposure source may be used when performing a photo-exposure and developing process for forming the first photoresist patterns 34. The KrF exposure source is inexpensive and has a low K1 index. Also, an exposure source including argon fluoride (ArF), fluorine ($F_2$), or E-beam may be used besides the KrF exposure source.

Figure 4C:
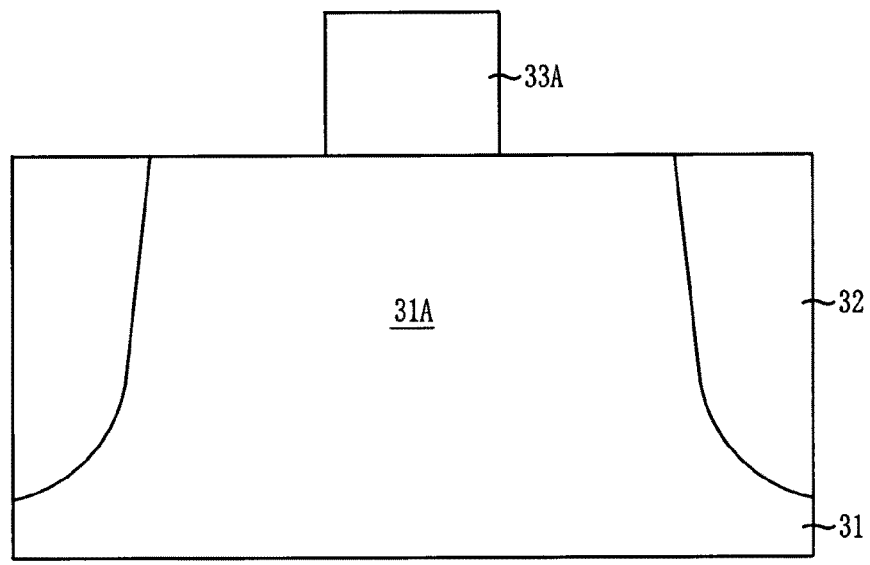
Figure 5C:
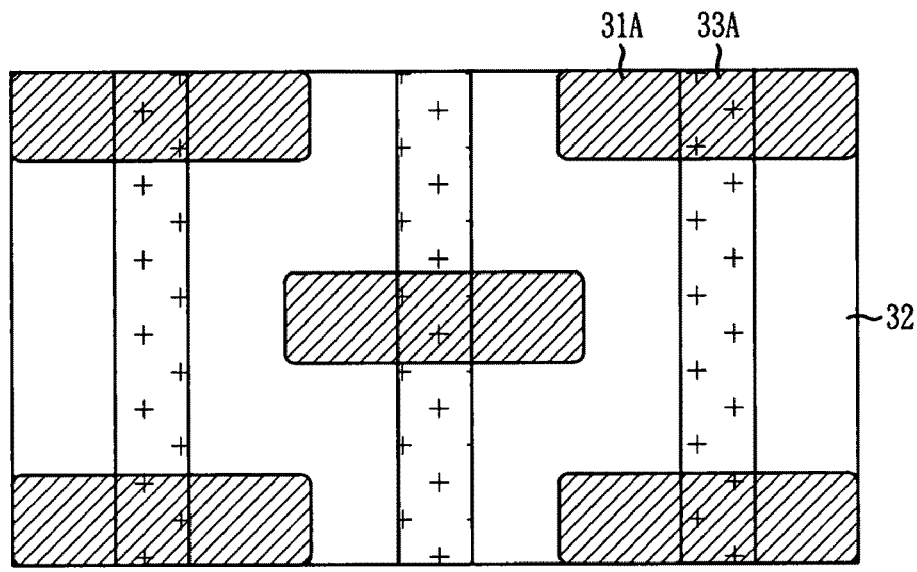

Referring to FIGS. 4C and 5C, the hard mask layer 33 is etched to form hard mask patterns 33A using the first photoresist patterns 34. The first photoresist patterns 34 are removed using a dry etch process. For instance, the first photoresist patterns 34 are removed using an oxygen removal process.

Figure 4D:
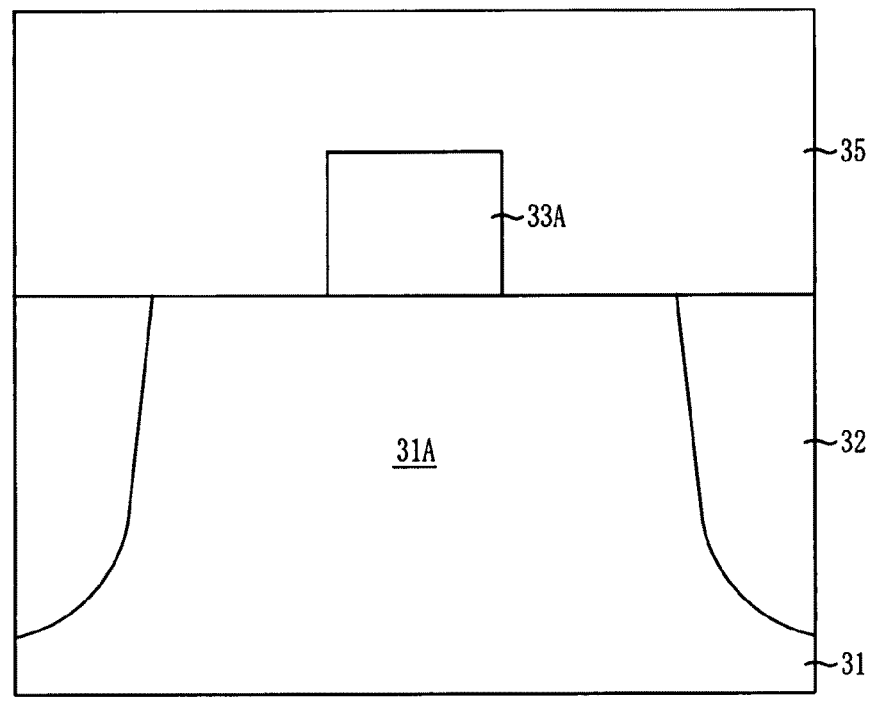
Figure 5D:
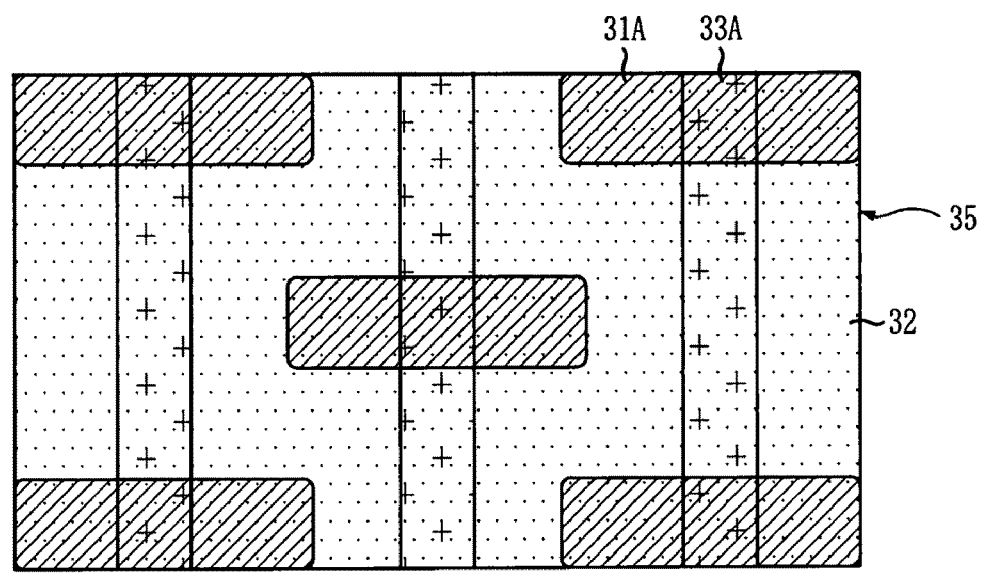

Referring to FIGS. 4D and 5D, a second photoresist layer 35 is formed over the resultant structure. The second photoresist layer 35 is illustrated as being transparent in FIG. 5D and in the following drawings for better understanding.

Figure 4E:
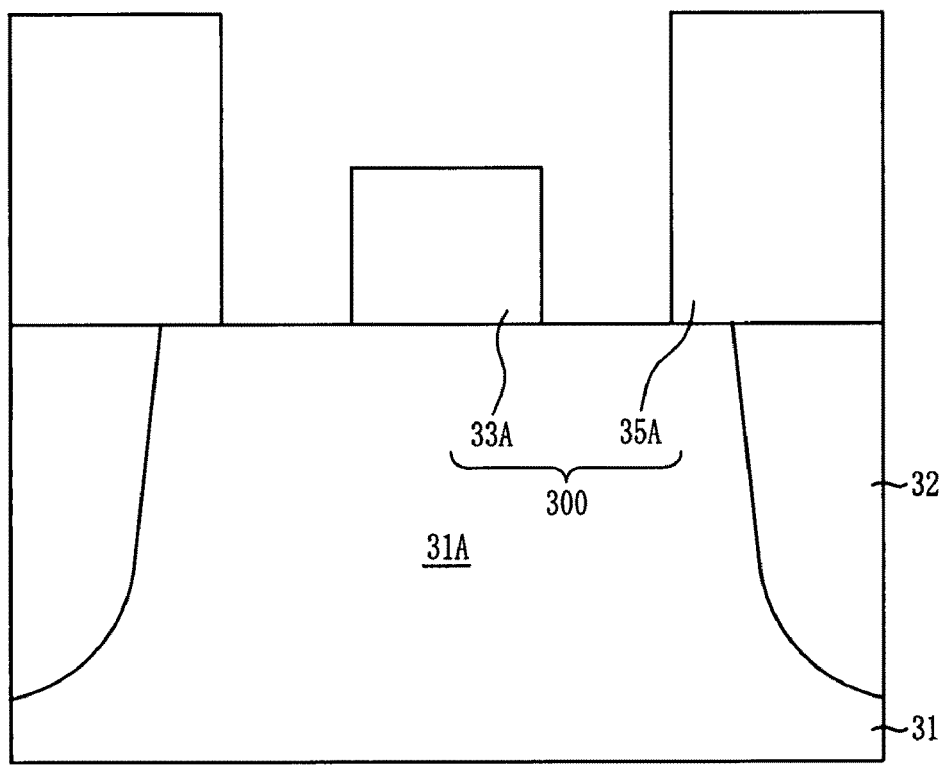
Figure 5E:
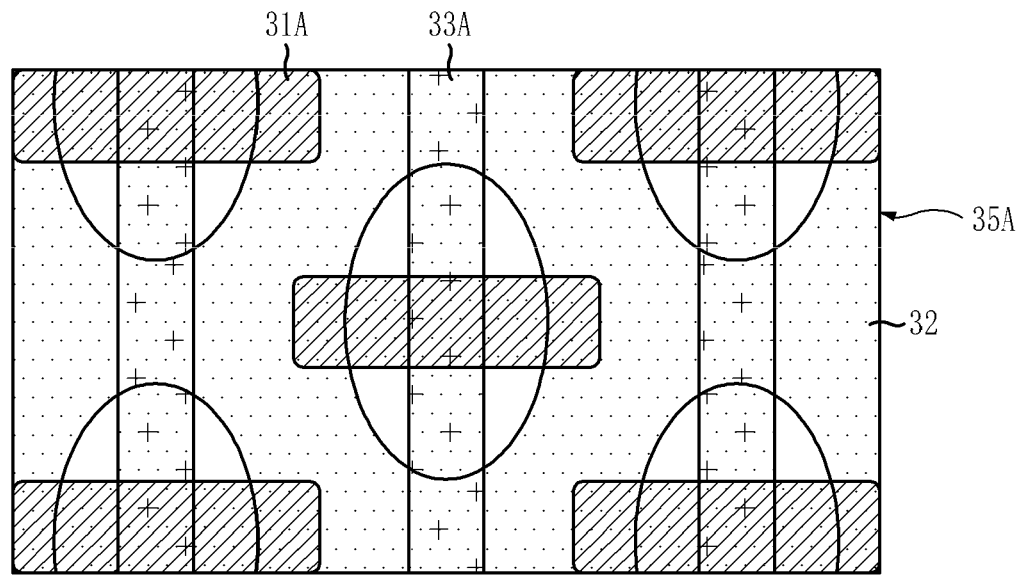

Referring to FIGS. 4E and 5E, a photo-exposure and developing process is performed on the second photoresist layer 35. Thus, a second photoresist pattern 35A is formed. The second photoresist pattern 35A includes trench type open regions which expose a portion of the active regions 31A. The exposed portion of the active regions 31A includes a region where the active regions 31A and the hard mask patterns 33A intersect each other. The second photoresist pattern 35A and the hard mask patterns 33A configure a mask pattern 300 which defines recess pattern regions.

A patterning margin decreases because the open regions of the second photoresist pattern 35A are larger than those of the typical method. That is, a KrF exposure source may be used when performing a photo-exposure and developing process for forming the second photoresist pattern 35A, like the first photoresist patterns 34, wherein the KrF exposure source is inexpensive and has a low K1 index. Also, an exposure source including ArF, $F_2$, or E-beam may be used besides the KrF exposure source.

Figure 4F:
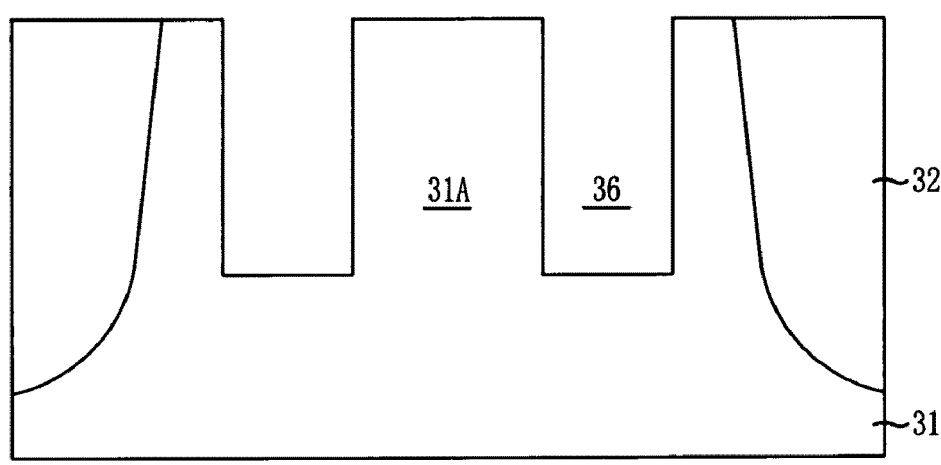
Figure 5F:
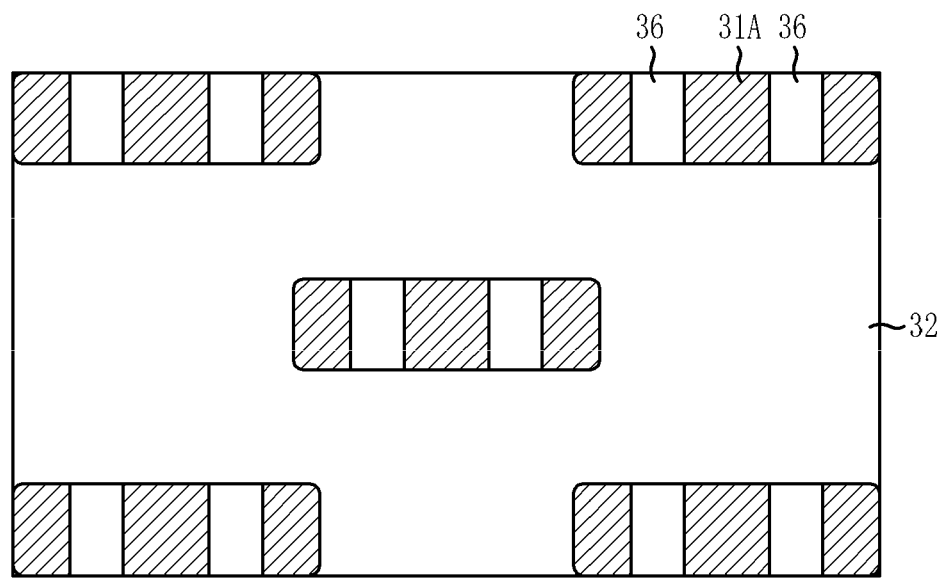

Referring to FIGS. 4F and 5F, the substrate 31 is etched to form recess patterns 36 using the mask pattern 300 as an etch mask. The mask pattern 300 is removed.

The recess patterns 36 are formed in the active regions 31A of the substrate 31 because the open regions of the second photoresist pattern 35A are formed in the trench type structure as shown in FIGS. 4E and 5E. In particular, the recess patterns 36 are not formed in the isolation structure 32, and damages on the active regions 31 of the substrate 31 adjacent to the isolation structure 32 may be substantially reduced. Thus, undesired couplings between the active regions 31A of the substrate 31 and subsequent gate patterns may be reduced when the subsequent gate patterns are formed.

According to the embodiment of the present invention, the recess patterns 36 are formed using the hard mask patterns 33A and the second photoresist pattern 35A as an etch mask. In particular, the recess patterns 36 are formed in the active regions 31A of the substrate 31 by forming the open regions of the second photoresist pattern 35A in the trench type. Thus, damages on the active regions 31 adjacent to the isolation structure 32 may be substantially reduced.

Also, the recess patterns 36 are formed using the mask pattern 300, which is a double mask pattern, including the hard mask patterns 33A and the second photoresist pattern 35A. Thus, the patterning margin may be secured. Consequently, it becomes possible to sufficiently pattern using the KrF exposure source which is inexpensive and has a low K1 index. Therefore, a process margin may be secured.

In accordance with the embodiment of the present invention, damages on the active regions of the substrate are substantially reduced when forming the recess patterns and the patterning margin is secured. Thus, the device reliability and the process margin may be secured.

That is, damages on adjacent cells may be substantially decreased to increase the process margin of the mask process and decrease undesirable events during the etch process by embodying the pattern with the trench type open regions. Thus, a refresh characteristic of the semiconductor device may be secured and a product development period may be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a recess pattern in a semiconductor device comprising:
   providing a substrate;
   forming an isolation structure in the substrate to define an active region in the substrate, wherein the isolation structure is formed outside the active region;
   forming a first mask pattern over the active region of the substrate in a line type structure, the first mask pattern exposing at least a portion of the active region;
   forming a second mask pattern comprising an open region over the substrate including the active region, the open region exposing a portion where the active region and the first mask pattern intersect, wherein the second mask pattern does not overlap the first mask pattern that is formed over the active region; and
   etching the active region of the substrate exposed by the first and second mask patterns to form recess patterns.

2. The method of claim 1, wherein the first mask pattern is formed in the line type structure that crosses a middle portion of the active region.

3. The method of claim 1, wherein forming the first mask pattern comprises:
   forming a hard mask layer over the substrate;
   forming a line type photoresist pattern over the hard mask layer; and
   etching the hard mask layer to form the first mask pattern using the photoresist pattern.

4. The method of claim 3, wherein forming the first mask pattern comprises using krypton fluoride (KrF) as an exposure source for forming the first mask pattern.

5. The method of claim 3, wherein forming the first mask pattern comprises using argon fluoride (ArF), fluorine ($F_2$), or E-beam as an exposure source for forming the first mask pattern.

6. The method of claim 1, wherein forming the second mask pattern comprises a photoresist pattern.

7. The method of claim 6, wherein forming the second mask pattern comprises using KrF as an exposure source for forming the second mask pattern.

8. The method of claim 6, wherein forming the second mask pattern comprises using ArF, $F_2$, or E-beam as an exposure source for forming the second mask pattern.

* * * * *